United States Patent [19]

Hatanaka

[11] Patent Number: 5,531,223
[45] Date of Patent: Jul. 2, 1996

[54] METHOD AND APPARATUS OF NUCLEAR MAGNETIC RESONANCE IMAGING WITH NONLINEARLY PROCESSED IMAGE DISPLAY

[75] Inventor: Masahiko Hatanaka, Tochigi-ken, Japan

[73] Assignee: Kabushiki Kaisha Toshiba, Japan

[21] Appl. No.: 265,686

[22] Filed: Jun. 23, 1994

Related U.S. Application Data

[63] Continuation of Ser. No. 654,258, Feb. 12, 1991, abandoned.

[30] Foreign Application Priority Data

Feb. 15, 1990 [JP] Japan ...................................... 2-32375
Jan. 11, 1991 [JP] Japan ..................................... 3-002150

[51] Int. Cl.$^6$ ................................................. A61B 5/055
[52] U.S. Cl. ...................... 128/653.2; 324/309; 382/274; 382/128
[58] Field of Search ............................. 128/653.2, 653.3, 128/653.4, 654; 324/309, 312; 436/173; 424/9, 9.3; 364/413.13, 413.16, 413.19, 413.22; 382/6, 54, 128, 274

[56] References Cited

U.S. PATENT DOCUMENTS

| | | | |
|---|---|---|---|
| 4,602,641 | 7/1986 | Feinberg | 128/653.3 |
| 4,609,872 | 9/1986 | O'Donnell | 324/306 |
| 4,701,709 | 10/1987 | Yamamoto et al. | 324/312 |
| 4,724,388 | 2/1988 | Sano et al. | 324/312 |
| 4,745,364 | 5/1988 | Hatanaka | 324/312 |
| 4,760,339 | 7/1988 | Yamamoto et al. | 324/312 |
| 4,761,819 | 8/1988 | Denison et al. | 382/54 |
| 4,982,160 | 1/1991 | Hagiwara | 324/309 |
| 5,070,876 | 12/1991 | Wright | 128/653.3 |

Primary Examiner—Krista M. Zele
Attorney, Agent, or Firm—Limbach & Limbach; Ronald L. Yin

[57] ABSTRACT

A method and an apparatus of nuclear magnetic resonance imaging capable of reducing the processing time in general, providing the nuclear magnetic resonance images with improved contrast among the imaged elements and reduced background noises, providing thee nuclear magnetic resonance images in which the preliminary processing using thresholds in various image processings becomes easier, and reducing the imaging time in obtaining the SAS image of high contrast resolution and satisfactory three dimensional quality. In the apparatus, a predetermined imaging pulse sequence is carried out in order to obtain nuclear magnetic resonance image data; a nonlinear operation is applied on the nuclear magnetic resonance image data in order to obtain contrast enhanced image data; and an image given by the contrast enhanced image data is displayed.

22 Claims, 6 Drawing Sheets

S(A):S(B)=1:5

$S^2(A):S^2(B)=1:25$

METHOD AND APPARATUS OF NUCLEAR MAGNETIC RESONANCE IMAGING WITH NONLINEARLY PROCESSED IMAGE DISPLAY

This is a continuation of application Ser. No. 07/654,258 filed on Feb. 12, 1991, now abandoned.

BACKGROUND OF THE INVENTION

1. Field of the Invention

The present invention relates to a nuclear magnetic resonance imaging, and more particularly, to a nuclear magnetic resonance imaging for obtaining SAS (surface anatomy scan) and angiographic images.

2. Description of the Background Art

In general, a nuclear magnetic resonance image is obtained by detecting nuclear magnetic resonance signals in terms of complex signals by using a quadrature detector, and then applying the complex Fourier transform to the detected complex signals in order to obtain complex image data $I=I_r+jI_j$.

Conventionally, the nuclear magnetic resonance image to be displayed on a display unit is then obtained from the complex image data I as an absolute value display $|I|=\sqrt{I_r^2+I_j^2}$, a phase corrected real image display $I_r$, a phase corrected imaginary image display $I_j$, or an argument image $\angle I=\text{Tan}^{-1}(I_j/I_r)$.

Among these displays, the absolute value display has a drawback that an additional processing time is required for carrying out a square root calculation. This can be a practically unnecessary disadvantage when the diagnosis using displays does not require the absolute value display.

In a case of obtaining the SAS image for showing a brain surface structure, first a spin echo multi-slice imaging is performed such that nuclear magnetic resonance echo signals for usual diagnostic images such as density emphasized images and $T_2$ emphasized images as well as echo signals for fat suppressed and cerebrospinal fluid emphasized images are obtained, and then the SAS image is obtained by applying a weighted sum calculation to the spin echo multi-slice images.

Here, the echo time TE for the spin echo multi-slice imaging have to be as long as 250 msec which is much longer than a case of obtaining the usual density emphasized image in which the required echo time is 20 msec or a case of obtaining the usual $T_2$ emphasized image in which the required echo time is 120 msec. This is because it is necessary in a case of obtaining the SAS image to enhance the contrast between the brain body and cerebrospinal fluid by collecting sufficiently larger amount of the nuclear magnetic resonance signals from the cerebrospinal fluid in the vadum which contains information on the brain surface structure than the nuclear magnetic resonance signals from the brain body. The reduction of the echo time results in the lowering of the contrast and the deterioration of the three dimensional quality of the SAS image.

This feature of the SAS image taking gives rise to a drawback that a number of slices that can be taken in a given echo pulse repetition time TR is smaller in a case of SAS image compared with other cases of usual images, so that in order to take the same number of slices a case of SAS image requires much longer period of time than cases of usual images, which is not desirable from a point of view of a safety of the patient.

As a solution to this problem, there is a method of using the multi-slice images taken with a shorter echo time TE such as 120 msec, and obtaining the three-dimensional quality by forming stereographic SAS images in which the weight sum calculation is varied and displaying the stereographic SAS images in a stereographic mode or an animation mode.

However, in the SAS image obtained by this method, the three dimensional quality of the SAS image is poorer than the SAS image obtained by the multi-slice images taken with a longer echo time TE such as 250 msec.

SUMMARY OF THE INVENTION

It is therefore an object of the present invention to provide a method and an apparatus of nuclear magnetic resonance imaging capable of reducing the processing time in general.

It is also an object of the present invention to provide a method and an apparatus of nuclear magnetic resonance imaging capable of providing the nuclear magnetic resonance images with improved contrast among the imaged elements and reduced background noises.

It is also an object of the present invention to provide a method and an apparatus of nuclear magnetic resonance imaging capable of providing the nuclear magnetic resonance images in which the preliminary processing using thresholds in various image processings becomes easier.

It is another object of the present invention to provide a method and an apparatus of nuclear magnetic resonance imaging capable of reducing the imaging time in obtaining the SAS image of high contrast resolution and satisfactory three dimensional quality.

According to one aspect of the present invention there is provided a method of nuclear magnetic resonance imaging, comprising the steps of: carrying out a predetermined imaging pulse sequence in order to obtain nuclear magnetic resonance image data; applying a nonlinear operation on the nuclear magnetic resonance image data in order to obtain contrast enhanced image data; and displaying an image given by the contrast enhanced image data.

According to another aspect of the present invention there is provided an apparatus for nuclear magnetic resonance imaging, comprising: imaging means for carrying out a predetermined imaging pulse sequence in order to obtain nuclear magnetic resonance image data; processing means for applying a nonlinear operation on the nuclear magnetic resonance image data in order to obtain contrast enhanced image data; and display means for displaying an image given by the contrast enhanced image data.

Other features and advantages of the present invention will become apparent from the following description taken in conjunction with the accompanying drawings.

DETAILED DESCRIPTION OF THE PREFERRED EMBODIMENTS

Figure 1:
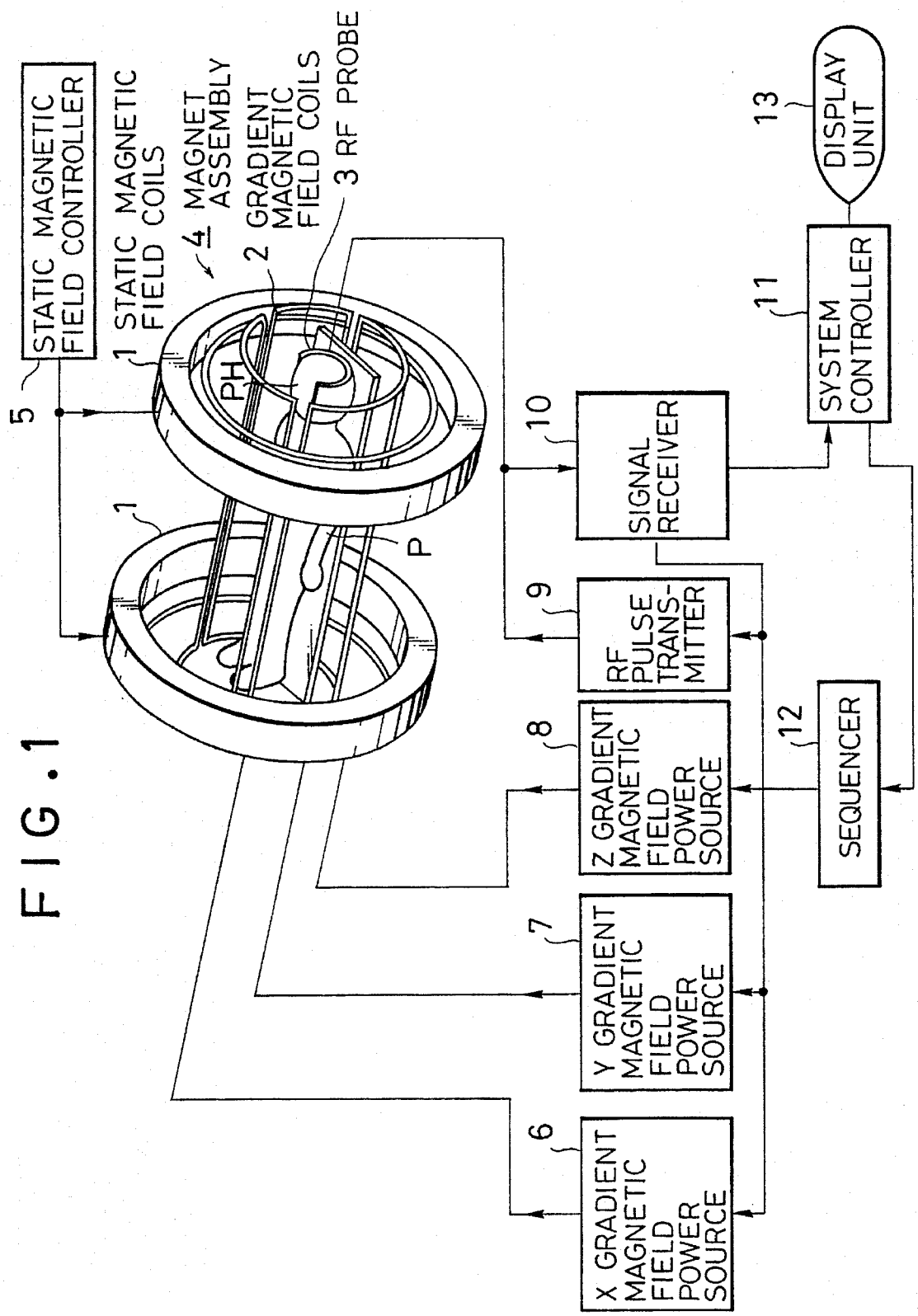
FIG. 1 is a schematic block diagram of one embodiment of a nuclear magnetic resonance imaging apparatus according to the present invention.

Referring now to FIG. 1, the first embodiment of a nuclear magnetic resonance imaging according to the present invention will be described.

A nuclear magnetic resonance imaging apparatus of this embodiment shown in FIG. 1 comprises a magnet assembly 4 including: a static magnetic field coils 1 for generating a static magnetic field in its bore region in which a patient P is placed; gradient magnetic field coils 2 for generating slicing, encoding and reading gradient magnetic fields in the bore region of the static magnetic field coils 1; and an RF probe 3 for generating RF pulses to be applied to the patient P and receiving nuclear magnetic resonance signals from the patient P which is shown to be located around a head portion PH of the patient P in FIG. 1.

The apparatus of FIG. 1 further comprises: a static magnetic field controller 5 for controlling the operation of the static magnetic field coils 1; X, Y, and Z gradient magnetic field power sources 6, 7, and 8 for supplying power to respective parts of the gradient magnetic field coils 2; an RF pulse transmitter 9 for supplying the RF pulses to the RF probe 3 and a signal receiver 10 for collecting the nuclear magnetic resonance signals received by the RF probe 3; a system controller 11 for controlling operations of the components of the apparatus and processing nuclear magnetic resonance signals collected by the signal receiver 10; a sequencer 12 for controlling the operation sequence of the X, Y, and Z gradient magnetic field power sources 6, 7, and 8 as well as the RF pulse transmitter 9 and the signal receiver 10 according to the control by the system controller 11; and a display unit 13 for displaying the nuclear magnetic resonance images obtained by the apparatus.

Figure 2:
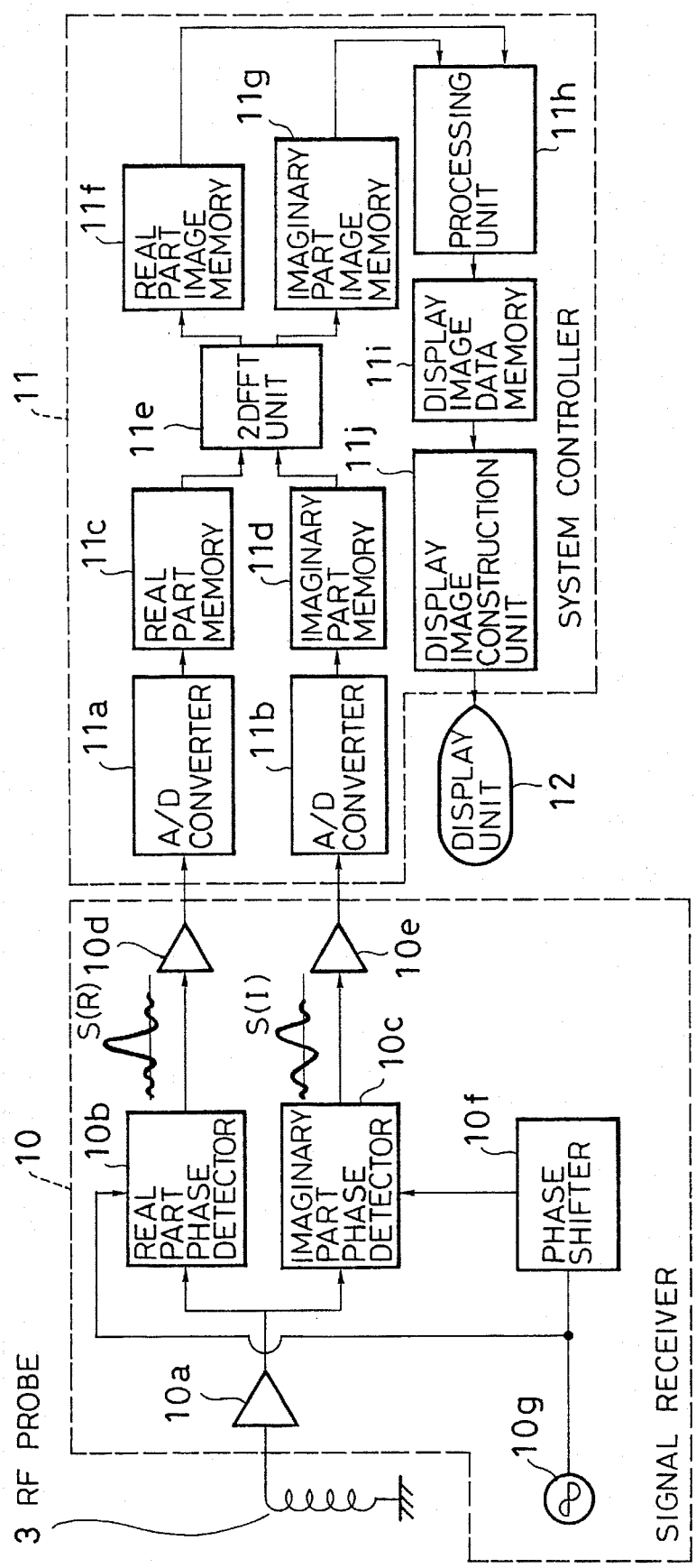
FIG. 2 is a detail block diagram of a signal receiver and a system controller of the apparatus of FIG. 1.
Figure 3:
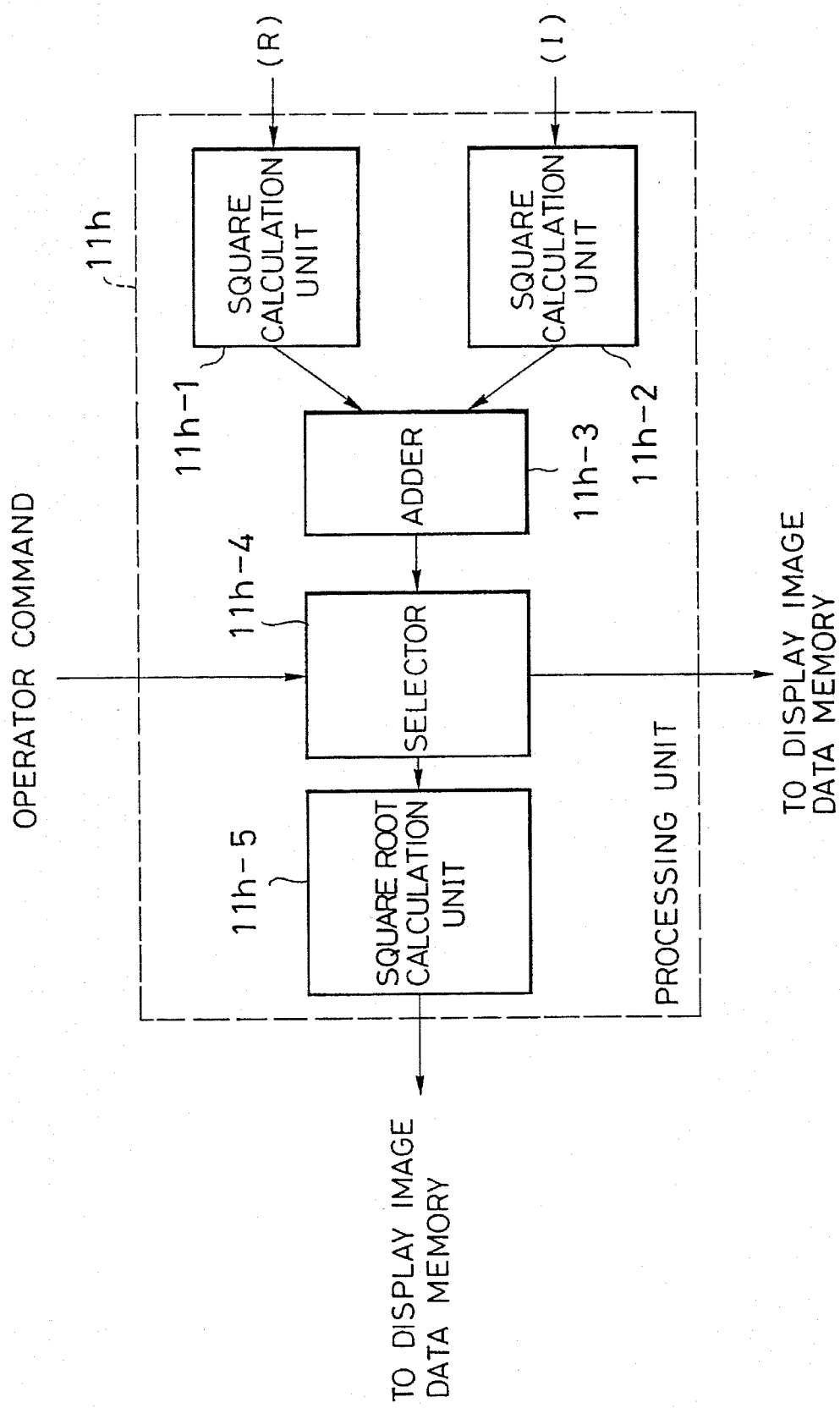
FIG. 3 is a detail block diagram of a processing unit in the system controller of FIG. 2.

As shown in FIG. 2, the signal receiver 10 further comprises: a pre-amplifier 10a; a real part phase detector 10b; an imaginary phase detector 10c; low frequency amplifiers 10d and 10e; a phase shifter 10f; and a reference wave generator 10g; while the system controller 11 further comprises: A/D converters 11a and 11b; a real part memory 11c; an imaginary part memory 11d; a two dimensional fast Fourier transform (2DFFT) unit 11e; a real part image memory 11f; an imaginary part image memory 11g; a processor unit 11h; an display image data memory 11i; and a display image construction unit 11j. Moreover, as shown in FIG. 3, the processing unit 11h of the system controller 11 further comprises: square calculation units 11h-1 and 11h-2; a adder 11h-3; a selector 11h-4; and a square root calculation unit 11h-5.

With these configuration, the signals receiver 10 and the system controller 11 operate as follows.

The nuclear magnetic resonance signals received by the RF probe 3 and transmitted to the signal receiver 10 are first amplified by the pre-amplifier 10a and then transmitted to the real part phase detector 10b and the imaginary part phase detector 10c. On the other hand, high frequency components from the reference wave generator 10g are transmitted directly to the real part phase detector 10b with no phase shift and through the phase shifter 10f to the imaginary part phase detector 10c with a 90 degree phase shift, such that real part low frequency signals S(R) and imaginary part low frequency signals S(I) are obtained by the real part phase detector 10b and the imaginary part phase detector 10c, and subsequently outputted to the system controller 11 through the low frequency amplifiers 10d and 10e.

In the system controller 11, the real part low frequency signals S(R) and the imaginary part low frequency signals S(I) are converted into digital real part signals DS(R) and digital imaginary part signals DS(I) by the A/D converters 11a and 11b and stored in the real part memory 11c and the imaginary part memory 11d. When all the nuclear magnetic signals are collected, the two dimensional fast Fourier transform is applied to the digital real part signals DS(R) and the digital imaginary part signals DS(I) stored in the real part memory 11c and the imaginary part memory 11d by the two dimensional fast Fourier transform unit 11e in order to obtain real part image data and imaginary part image data which are subsequently stored in the real part image memory 11f and the imaginary part image memory 11g. Then, the square of each pixel of the real part image data and the imaginary part image data stored in the real part image memory 11f and the imaginary part image memory 11g is calculated by the square calculation unit 11h-1 and 11h-2 of the processing unit 11h, and the corresponding squared real part and imaginary part data are added by the adder 11h-3 to obtain the display image data. Then, when an operator command to select the square display is given, the selector 11h-4 transmits the output of the adder 11h-3 directly to the display image data memory 11i, whereas when an operator command to select the absolute value display is given, the selector 11h-3 transmits the output of the adder 11h-3 to the square root calculation unit 11h-5 which calculates the absolute value display image data by calculating the square root of the output of the adder 11h-3 which are subsequently stored in the display image data memory 11i. The display image is then constructed from the display image data in the display image data memory 11i at the display image construction unit 11j and subsequently displayed by the display unit 12.

Now, the operation of the above described apparatus of FIG. 1 will be described in detail.

First, the RF pulses are applied by the RF probe 3 to the patient P placed in the static magnetic field generated by the static magnetic field coils 1 and the slicing gradient magnetic field in the Z direction generated by the gradient magnetic field coils 2 in order to selectively excite the spins of the patient P in a slice region determined by the slicing gradient magnetic field. Then, the encoding gradient magnetic field in the Y direction is applied by the gradient magnetic field coils 2 to the excited spins in order to carry out phase encoding, and then the reading gradient magnetic field in the X direction is applied by the gradient magnetic field coils 2 in order to collect the nuclear magnetic resonance signals. This sequence is repeated for a predetermined number of times in the repetition time TR according to the pulse sequencer given by the sequencer 12, so as to achieve the spin echo multi-slice imaging.

The nuclear magnetic resonance signals received by the RF probe 3 are collected by the signal receiver 10 by using the quadrature detection, and transmitted in terms of complex signals to the system controller 11. The system controller 11 then applies the complex Fourier transform to the complex signals in order to obtain the complex image data $I=I_r+jI_i$. Then, from the complex image data I, the processing unit 11h of the system controller 11 obtains the usual absolute value display $|I|=\sqrt{I_r^2+I_j^2}$ as well as the square display $I^2=I_r^2+I_j^2$ which can be obtained in a course of obtaining the absolute value display $|I|$, as described above.

There are several advantageous uses of the square display $I^2$, or more generally the nonlinearly processed display, which will now be described.

Figure 4:
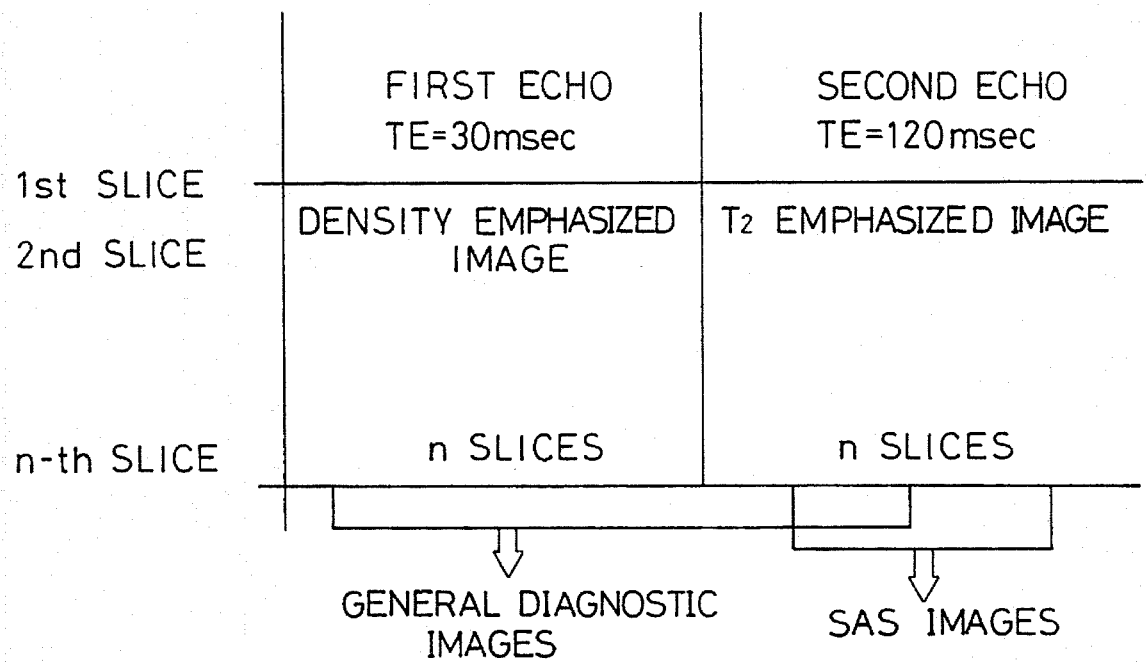
FIG. 4 is a diagram for explaining spin echo multi-slice imaging performed by the apparatus of FIG. 1.
Figure 5A:
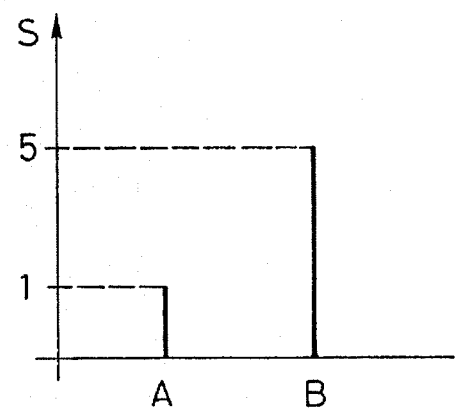
FIGS. 5(A) and 5(B) are graphs of signal strengths for an unprocessed case and a squared case.
Figure 5B:
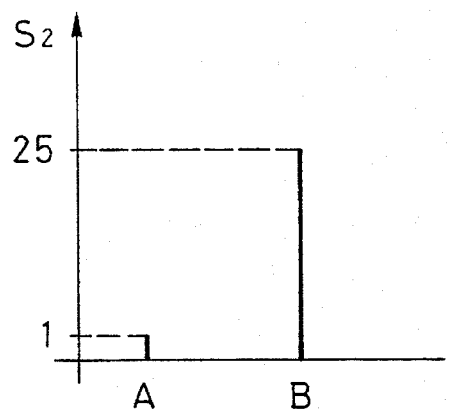
Figure 6:
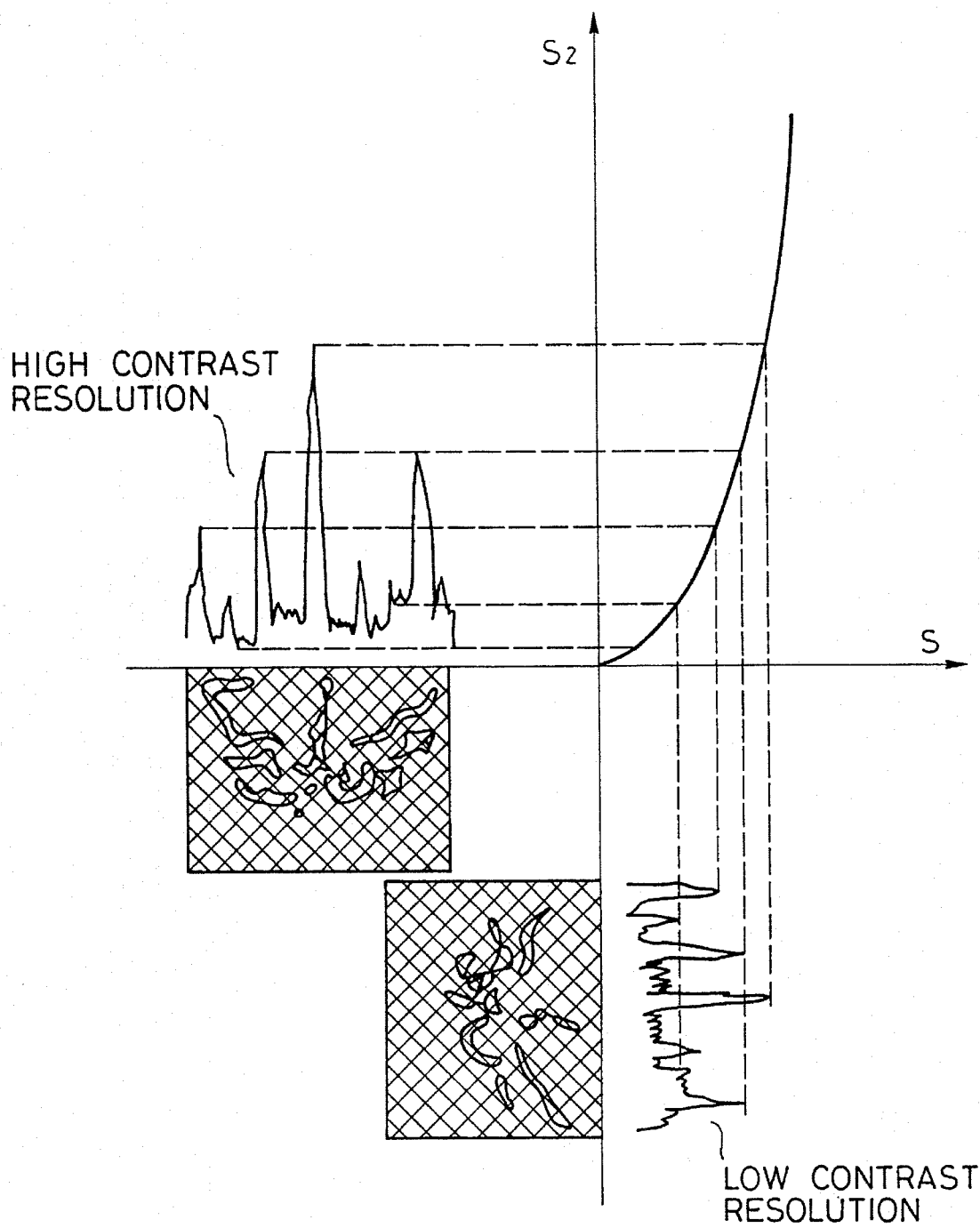
FIG. 6 is a graph for explaining the contrast improving effect of the square display.

As a first advantageous use, there is a use of the square display for the $T_2$ emphasized image which is often utilized in the general clinical diagnosis using the nuclear magnetic resonance imaging. The $T_2$ emphasized image is usually obtained by the spin echo multi-slice imaging under the condition of the repetition time TR=3000 msec, and the echo time TE=30 msec and 120 msec. As shown in FIG. 4, the first echo of TE=30 msec is used to obtain the density emphasized image slices, while the second echo of TE=120 msec is used to obtain the $T_2$ emphasized image slices. The $T_2$ emphasized image so obtained has a contrast between the brain body and the cerebrospinal fluid. This contrast can be enhanced and the contrast resolution can be improved by using the square display for the $T_2$ emphasized image. Namely, in this case, a squared signal $S^2$ of a signal S for each pixel of the $T_2$ emphasized image is obtained by the processing unit 11h, so that as shown in FIGS. 5(A) and 5(B), the signals S(A) and S(B) at positions A and B which have an original relative ratio of 1:5 can be converted in the signals $S^2(A)$ and $S^2(B)$ having an enhanced relative ratio of 1:25 as a result. In other words, relatively strong signals are strengthened by a higher rate than relatively weak signals, such that the relatively strong signals are relatively emphasized while the relatively weak signals are relatively suppressed. Consequently, the background noise is effectively suppressed and the contrast resolution can be improved as shown in FIG. 6.

Thus, by using the square display for the $T_2$ emphasized image, as high a contrast as that obtainable by the specialized imaging of the $T_2$ emphasized image with TE=250 msec can be obtained by using the usual spin echo multi-slice imaging with TE=120 msec, without requiring any additional extra imaging activity.

Figure 7:
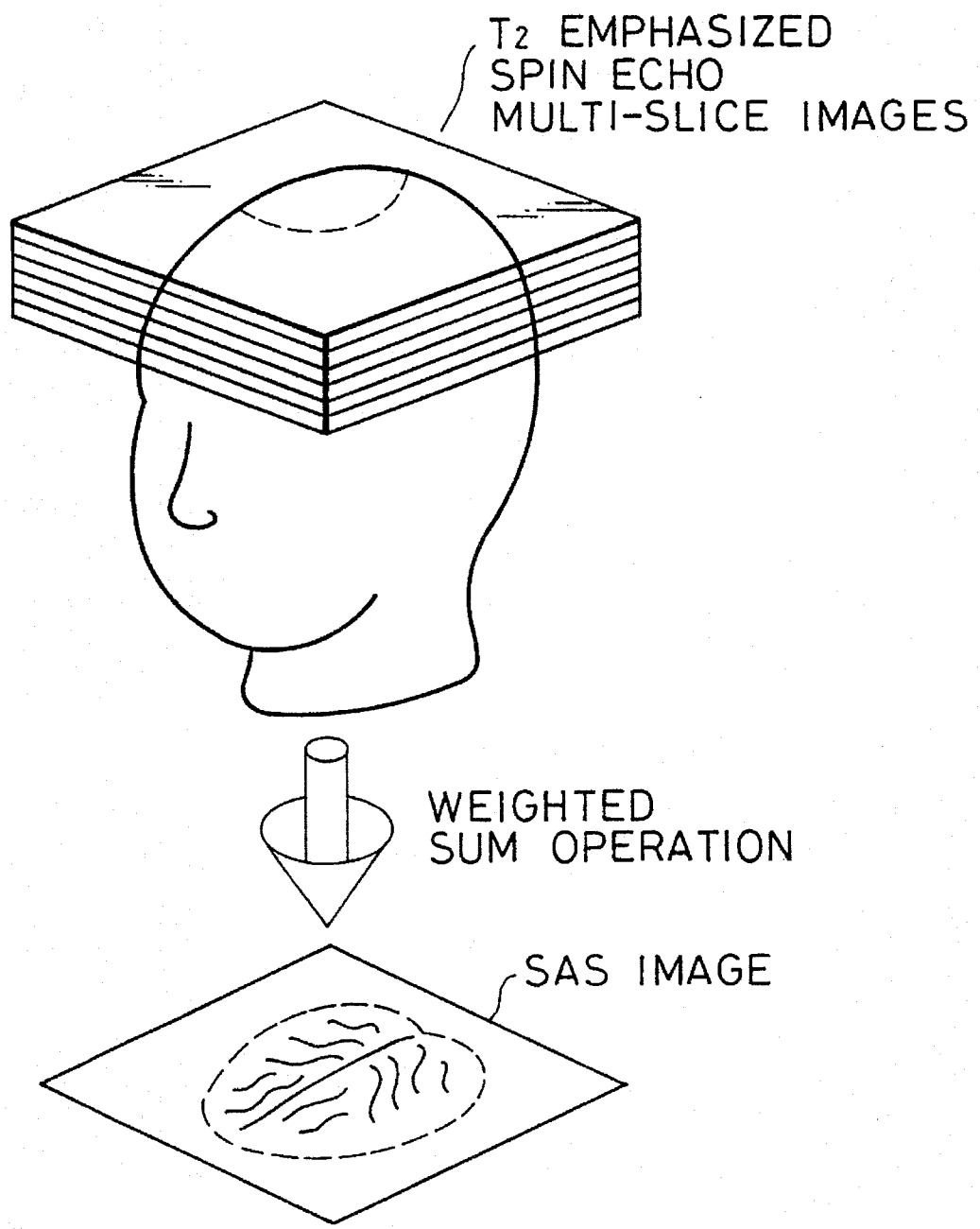
FIG. 7 is a conceptual diagram for explaining a process of obtaining the SAS image from the spin echo multi-slice images.

The second advantageous use of the square display is for obtaining the SAS image as a weighted sum of the usual spin echo multi-slice $T_2$ emphasized images as shown in FIG. 7. As already mentioned above, the $T_2$ emphasized image is usually obtained by the spin echo multi-slice imaging under the condition of the repetition time TR=3000 msec, and the echo time TE=30 msec and 120 msec. Now, the $T_2$ emphasized image slices due to the second echo of TE=120 msec are used in obtaining the SAS image. Here, if the unprocessed $T_2$ emphasized images are used, the satisfactory contrast resolution cannot be obtained in the resulting SAS image. However, by using the contrast enhanced square display of the $T_2$ emphasized images as a source of the SAS image, as high a contrast as that obtainable by the specialized imaging of the $T_2$ emphasized image with TE=250 msec can be obtained by using the usual spin echo multi-slice imaging with TE=120 msec, without requiring any additional extra imaging activity. This effectively reduces the very long imaging time conventionally associated with the SAS imaging.

The third advantageous use of the square display is for obtaining the angiographic image from a plurality of blood vessel emphasized images. Here, as in the previous cases, the use of the square display for the blood vessel emphasized images, the contrast in the blood vessel emphasized images can be enhanced, and consequently the contrast resolution in the angiographic image can be improved.

It is to be noted that, in any of the above described cases, the square display $I^2$ can be obtained by using an intermediate result in a course of obtaining the usual absolute value display $|I|$, so that there is no need to introduce new element for this purpose.

It is further to be noted that the other nonlinear operation such as $S^L$ (L>1), exp(S), and $K^S$ (K>1) may be used instead of the square calculation in any of the above described cases, by which the same effect can be obtained.

It is also to be noted that the spin echo multi-slice imaging utilized in the above embodiment may be replaced by other imaging pulse sequences such as a gradient field echo multi-slice imaging or a spin echo single-slice imaging, without affecting the advantageous effects of the present invention.

Besides these, many modifications and variations of the above embodiments may be made without departing from the novel and advantageous features of the present invention. Accordingly, all such modifications and variations are intended to be included within the scope of the appended claims.

What is claimed is:

1. A method of generating a contrast enhanced nuclear magnetic resonance image, comprising
   carrying out a predetermined imaging pulse sequence by an MRI apparatus means to obtain nuclear magnetic resonance image signals of a parameter of a nuclear magnetic resonance image;
   operating non-linearly on the nuclear magnetic resonance image signals by a processor means for processing the nuclear magnetic resonance image signals obtained by the MRI apparatus means, to obtain contrast enhanced image signals having an enhanced contrast of said parameter; and
   forming and displaying the contrast enhanced nuclear magnetic resonance image according to said contrast enhanced image signals obtained by the processor means.

2. The method of claim 1, wherein the operating step further comprises:
   increasing relatively strong nuclear magnetic resonance image signals and decreasing relatively weak nuclear magnetic resonance image signals.

3. The method of claim 2, wherein the operating step comprises:
   squaring the nuclear magnetic resonance image signals.

4. The method of claim 2 wherein the operating step further comprises taking the square root of the contrast enhanced image signals to obtain absolute value image signals.

5. The method of claim 1, wherein the predetermined imaging pulse sequence is a spin echo multi-slice sequence for obtaining nuclear magnetic resonance image signals from a plurality of slices and wherein the operating step is applied to each slice.

6. The method of claim 5, wherein the image formed by the display of said contrast enhanced image signals of each slice is a $T_2$ emphasized image.

7. The method of claim 6, wherein the image formed by the display of said contrast enhanced image signals of each slice is a surface anatomy scan image.

8. The method of claim 6, wherein the spin echo multi-slice imaging method is carried out with an echo time of 120 msec.

9. The method of claim 5, wherein the image formed by the display of said contrast enhanced image signals of each slice is a blood vessel emphasized image.

10. The method of claim 9, wherein said blood vessel emphasized image is an angiographic image.

11. The method of claim 1, wherein the predetermined imaging pulse sequence provides spin echo multi-slice nuclear magnetic resonance image signals.

12. An apparatus for nuclear magnetic resonance imaging, comprising:

imaging means for carrying out a predetermined imaging pulse sequence to obtain nuclear magnetic resonance image signals of a parameter of a nuclear magnetic resonance image;

processing means for operating non-linearly on the nuclear magnetic resonance image signals obtained by the imaging means, to obtain contrast enhanced image signals having an enhanced contrast of said parameter; and image forming and displaying means for forming and displaying a contrast enhanced image according to the contrast enhanced image signals obtained by the processing means.

13. The apparatus of claim 12, wherein the processing means comprises means for increasing relatively strong signals and for decreasing relatively weak signals.

14. The apparatus of claim 13, wherein the processing means operates on the nuclear magnetic resonance image signals by squaring the signals.

15. The apparatus of claim 14, further including:

means for applying a square root operation on the contrast enhanced image signals to obtain absolute value image signals; and means for selectively connecting one of the contrast enhanced image signals and absolute value image signals to the display means.

16. The apparatus of claim 12, wherein the predetermined imaging pulse sequence is a spin echo multi-slice sequence for obtaining magnetic resonance image signals from a plurality of slices and wherein processing means operates on each slice.

17. The method of claim 16, wherein the image formed by the displaying means is a $T_2$ emphasized image.

18. The apparatus of claim 17, wherein the image formed by the displaying means is a surface anatomy scan image.

19. The apparatus of claim 17, wherein the spin echo multi-slice imaging method is carried out with an echo time of 120 msec.

20. The apparatus of claim 16, wherein the image formed by the displaying means is a blood vessel emphasized image.

21. The apparatus of claim 20, wherein said blood vessel emphasized image is an angiographic image.

22. The apparatus of claim 12, wherein the predetermined imaging pulse sequence provides spin echo multi-slice nuclear magnetic resonance image signals.

* * * * *